(12) United States Patent
Hoshino et al.

(10) Patent No.: US 12,043,447 B2
(45) Date of Patent: Jul. 23, 2024

(54) PACKAGING CONTAINER FOR TRANSPORTING CERAMIC SUBSTRATES

(71) Applicants: KABUSHIKI KAISHA TOSHIBA, Tokyo (JP); TOSHIBA MATERIALS CO., LTD., Yokohama (JP)

(72) Inventors: Masanori Hoshino, Yokohama (JP); Hiromasa Kato, Nagareyama (JP); Hideki Sato, Yokohama (JP)

(73) Assignees: Kabushiki Kaisha Toshiba, Tokyo (JP); Toshiba Materials Co., Ltd., Yokohama (JP)

( * ) Notice: Subject to any disclaimer, the term of this patent is extended or adjusted under 35 U.S.C. 154(b) by 0 days.

(21) Appl. No.: 17/814,570

(22) Filed: Jul. 25, 2022

(65) Prior Publication Data
US 2022/0355978 A1    Nov. 10, 2022

Related U.S. Application Data

(63) Continuation of application No. PCT/JP2021/002745, filed on Jan. 27, 2021.

(30) Foreign Application Priority Data

Jan. 30, 2020    (JP) .................................. 2020-014207

(51) Int. Cl.
  *B65D 81/02*    (2006.01)
  *B65D 6/00*    (2006.01)
  *B65D 25/10*    (2006.01)
(52) U.S. Cl.
  CPC ............ *B65D 25/107* (2013.01); *B65D 11/10* (2013.01); *B65D 11/20* (2013.01)

(58) Field of Classification Search
  CPC ...... B65D 11/10; B65D 11/20; B65D 25/107; B65D 81/02; H01L 21/67303; H01L 21/67369; H01L 21/67386
  (Continued)

(56) References Cited

U.S. PATENT DOCUMENTS 4,339,039 A * 7/1982 Mykleby .............. B65D 81/107
  220/918
4,427,114 A * 1/1984 Howell ................ H05K 9/0067
  206/709
(Continued)

FOREIGN PATENT DOCUMENTS

EP    0 441 149 A1    8/1991
JP    H11-049266 A    2/1999
(Continued)

OTHER PUBLICATIONS

International Search Report and Written Opinion (Application No. PCT/JP2021/002745) dated Mar. 30, 2021 (with English translation).
(Continued)

*Primary Examiner* — Luan K Bui
(74) *Attorney, Agent, or Firm* — BURR PATENT LAW, PLLC (57) ABSTRACT

A packaging container for transporting ceramic substrates according to the present embodiment includes a bottom portion in a rectangular shape, and four side portions connected to four edges of the bottom portion respectively. Side protrusions having a height of 2 mm or more and protruding inward are provided on at least two opposite side portions among the four side portions. The bottom portion is provided with a bottom protrusion having a height of 2 mm or more and protruding inward.

15 Claims, 9 Drawing Sheets

(58) Field of Classification Search
USPC ....... 206/449, 454, 455, 583, 585, 587, 591, 206/592, 564
See application file for complete search history.

(56) References Cited

U.S. PATENT DOCUMENTS

| | | | |
|---|---|---|---|
| 8,162,147 B1* | 4/2012 | Ting | B65D 25/06 |
| | | | 206/707 |
| 2010/0038273 A1* | 2/2010 | Johnson | B01L 3/508 |
| | | | 53/473 |
| 2016/0107828 A1* | 4/2016 | Zhao | B65D 81/025 |
| | | | 206/454 |
| 2016/0114955 A1 | 4/2016 | Zhao et al. | |
| 2019/0031566 A1 | 1/2019 | Imamura et al. | |
| 2019/0204656 A1* | 7/2019 | Lv | B65D 81/113 |

FOREIGN PATENT DOCUMENTS

| | | |
|---|---|---|
| JP | 2002-154582 A | 5/2002 |
| JP | 2003-273189 A | 9/2003 |
| JP | 2006-069620 A | 3/2006 |
| JP | 2014-088194 A | 5/2014 |
| JP | 6399252 B2 | 10/2018 |
| JP | 2019-018866 A | 2/2019 |

OTHER PUBLICATIONS

Chinese Office Action (with English translation) dated Jan. 15, 2024 (Application No. 202180011689.6).
Extended European Search Report dated Jan. 22, 2024 (Application No. 21748131.6).

* cited by examiner

PACKAGING CONTAINER FOR TRANSPORTING CERAMIC SUBSTRATES

CROSS-REFERENCE TO RELATED APPLICATION

This application is a Continuation Application of No. PCT/JP2021/002745, filed on Jan. 27, 2021, and the PCT application is based upon and claims the benefit of priority from Japanese Patent Application No. 2020-014207, filed on Jan. 30, 2020, the entire contents of which are incorporated herein by reference.

FIELD

Embodiments described later relate to a packaging container for transporting ceramic substrates.

BACKGROUND

In recent years, along with the development of semiconductor devices such as power electronics and next-generation power semiconductors that require a large current, the demand for ceramic substrates has been increasing year by year. In particular, as the heat generation of the element increases because of the miniaturization and high performance, the thickness of the ceramic substrate tends to become thinner in order to efficiently dissipate heat.

As electrical products become smaller and have higher performance, electronic components tend to become smaller and generate more heat from semiconductors due to higher output. The ceramic substrates are used for electrical insulation of electronic components, and thinner substrates are required so as to improve heat dissipation characteristics as electronic components become smaller. Many ceramic substrates have high electrical insulation and high heat dissipation characteristics, but they are also hard but brittle that require careful attention when being moved or transported. Further, since the ceramic substrate is a sintered body that has warpage and uneven surface, when it is packed in layers, stress is applied and causes chipping and crack defects.

On the other hand, in order to reduce the manufacturing cost of the ceramic substrate, it is manufactured in a larger size. Among the ceramic substrates, a silicon nitride substrate having high strength, high toughness, and high heat dissipation is made in a size of 220 mm×220 mm×0.32 mm (Patent Document 1: Japanese Patent No. 6399252).

The magazine-type rack has a large transport capacity, and it is difficult to reuse the cushioning material provided between and around the ceramic substrates. Therefore, it has been a problem from the viewpoint of resource saving.

Further, regarding a ball lens that is also easily broken like a ceramic substrate, a packaging container for transportation has been proposed to prevent damage due to vibration or dropping when storing, packing and transporting the ball lens (e.g., Patent Document 2: Japanese Patent Laid-Open No. 2006-69620).

However, in the case of reusing the storage container for the ceramic substrate, for example, when it is transported over a long distance to overseas, it may be costly to send the packaging container back from the transportation destination to the manufacturer. In addition, even when the packaging container is not reused, from the resource saving viewpoint, the packaging container is required to provide packaging as simple as possible.

The packaging container stores a ceramic substrate set (hereinafter, simply referred to as a "substrate set") that includes multiple ceramic substrates being stacked. Along with the thinning of ceramic substrate parts due to the increase in the heat generation of semiconductor elements in recent years and increase in size during manufacturing, the packaging container is required to reduce the chipping of the ceramic substrate due to impact from the outside to the packaging container during transportation and the impact from the adjacent ceramic substrates.

BRIEF DESCRIPTION OF THE DRAWINGS

Each of FIGS. 2A to 2E is a diagram showing a case where the side protrusions and the bottom protrusions protrude in a semicircular shape in the packaging container for transporting ceramic substrates according to the first embodiment.

Each of FIGS. 4A to 4E is a diagram showing a case where the side protrusions and the bottom protrusions protrude in a U-shape in the packaging container for transporting ceramic substrates according to the first embodiment.

DETAILED DESCRIPTION

A packaging container for transporting ceramic substrates according to the present embodiment includes a bottom portion in a rectangular shape, and four side portions connected to four edges of the bottom portion respectively. Side protrusions having a height of 2 mm or more and protruding inward are provided on at least two opposite side portions among the four side portions. The bottom portion is provided with a bottom protrusion having a height of 2 mm or more and protruding inward.

More preferably, the packaging container for transporting ceramic substrates according to the embodiment has a configuration for accommodating the substrate set such that the outer surfaces of the two ceramic substrates at both ends of the substrate set respectively face two opposite side portions among the four side portions. Then, two or more rows of side protrusions extending continuously in the depth direction are provided on each of the two opposite side portions, while two or more rows of bottom protrusions extending continuously in the direction from one side to the other side of the two opposite side portions are provided on the bottom portion as the bottom protrusion. This example will be described later with reference to FIGS. 1 to 4E of the first embodiment of the present invention.

Alternatively, the packaging container for transporting ceramic substrates according to the embodiment has a configuration for accommodating the substrate set such that an outer surface of the ceramic substrate at one end of the substrate set faces the bottom portion. Then, two or more rows of bottom protrusions extending continuously in the depth direction are provided on each of the four side portions as the side protrusion. This example will be described later with reference to FIGS. 5 to 11 of the second embodiment of the present invention.

Alternatively, the packaging container for transporting ceramic substrates according to the embodiment has a configuration for accommodating the substrate set such that an outer surface of the ceramic substrate at one end of the substrate set faces the bottom portion. Then, the area of one bottom protrusion provided on the bottom portion occupies 25% or more of the total area of the bottom portion. This example will be described later with reference to FIG. 12 of the second embodiment of the present invention.

Defects such as cracks are likely to occur in the stored ceramic substrate due to the vertical force towards a surface of the substrate set in the packaging container. Further, due to the horizontal force towards the surface of the substrate set in the packaging container, defects such as chipping may occur at the edge of the ceramic substrate.

Furthermore, there is a gap between adjacent ceramic substrates of the substrate set in the packaging container, or gaps between the outer surfaces of the ceramic substrates at both ends of the substrate set in the packaging container and the side of the packaging container. In that case, adjacent ceramic substrates collide with each other due to vibration during transportation of the packaging container, which causes defects such as cracking or chipping of the ceramic substrates. At this time, since the ceramic substrate has warpage and thickness variation, if not specifying the storage quantity and using the cushioning material, it is difficult to store the ceramic substrate in the packaging container without a gap.

The packaging container for transporting ceramic substrates according to the first embodiment of the present invention stores the substrate set such that the outer surfaces of the two ceramic substrates at both ends of the substrate set face two opposite side portions among the four side portions. That is, the packaging container stores the substrate set vertically with the edge of each ceramic substrate facing down. In this packaging container, two or more rows, e.g., two rows of side protrusions protruding inward and extending continuously in the depth direction are formed on the side portions that face the outer surfaces of the two ceramic substrates at both ends of the substrate set.

With such a configuration, the two rows of side protrusions serve as cushions in the direction perpendicular to the two ceramic substrates at both ends. As a result, it is possible to prevent cracking and chipping defects of each ceramic substrate of the stored substrate set. Since the ceramic substrate has a small warp, the substrate set can be stored in the packaging container by applying a light force to the side protrusions on the two side portions. Further, after the substrate set is inserted, the warp of the ceramic substrates returns to the original shape, so that the substrate set can be filled in the packaging container without any gap. The inserted substrate set is fixed in the packaging container by the side protrusions of the two side portions as the cushion and the force that the pressed substrate set returns to the original shape.

If there is only one side protrusion (same for the bottom protrusion) provided on one side portion, for example, one row, when the width of the side protrusion is wide and the ratio of the area occupied by the side protrusion is 25% or more of the entire side portion, it is useful because the substrate set can be fixed on a surface. Since the larger the ratio of the area occupied by the side protrusion is, the larger the fixed range becomes, the ratio of the area occupied by the side protrusion being 50% or more is even more preferable. When the ratio of the area occupied by the side protrusion is less than 25%, the substrate set may be inserted diagonally and move around the side protrusion due to vibration during transportation or the like. Therefore, it is desirable that there are two or more side protrusions, for example, two or more rows.

Further, in the packaging container for transporting ceramic substrates according to the first embodiment of the present invention, two or more rows, e.g., two rows of bottom protrusions are formed on the bottom portion. The two rows of bottom protrusions protrude inward and extend continuously in the direction from one side portion to the opposite side portion on which the side protrusions are provided. This bottom protrusion serves as a cushion in the direction perpendicular to the lower edge of the substrate set. In this case, the substrate set is inserted such that the side protrusions face the outer surfaces of the two ceramic substrates at both ends. As a result, the lower edge of the substrate set is supported by the two rows of the bottom protrusion.

A packaging container having one, e.g., one row of bottom protrusion of the packaging container is useful when the width of the bottom protrusion is wide and the ratio of the bottom protrusion to the entire bottom portion is 25% or more. It is desirable that there are two or more bottom protrusions because the substrate set may be inserted diagonally and move around the narrow bottom protrusion in the vertical direction due to vibration during transportation or the like.

The packaging container for transporting ceramic substrates according to the second embodiment of the present invention stores the substrate set such that the outer surface of the ceramic substrate at one end of the substrate set faces the bottom portion. That is, it is a case where the ceramic substrates are stacked over the flat surface to form the substrate set, and the substrate set is stored in the packaging container with its flat surface facing down. In this packaging container, two or more rows, e.g. two rows of side protrusions protruding inward continuously extending in the depth direction are formed on the four side portions.

With such a configuration, the two rows of side protrusions serve as a horizontal cushion to the surface of the ceramic substrate, and it is possible to prevent cracking and chipping defects of each ceramic substrate of the stored substrate set. In the packaging container for transporting ceramic substrates according to the second embodiment, for example, it is a container having a rectangular bottom portion, while two or more side protrusions are formed on each of the four side portions. Even the ceramic substrates to be packed have variations in dimensions, they can be inserted by the weight of the substrate set if the packaging container has cushioning property. After insertion, the substrate set is held by the side and below by the cushioning property of the packaging container and the weight of the substrate set. Therefore, the substrate set is fixed to the packaging container by being covering with a cushioning material or the like from above.

Even there is only one, e.g., one row of side protrusion (same for the bottom protrusion) provided on one side portion, it is useful when the width of the side protrusion is wide and the ratio of the area occupied by the side protrusion is 25% or more of the side portion. When the ratio of the area occupied by the side protrusion is less than 25% of the entire side portion, the substrate set may not be fixed but move around the side protrusion. Therefore, it is desirable that two or more, e.g., two or more rows of side protrusions are provided.

Further, having one, e.g., one row of bottom protrusion in packaging containers is useful if the width of the bottom protrusion is wide and the ratio of the bottom protrusion to the entire bottom portion is 25% or more. If area of the bottom protrusion occupies less than 25% of the entire bottom portion, the substrate set may be inserted diagonally and move around the bottom protrusion in the depth direction. In such case, two or more, for example, two or more rows of bottom protrusions being provided are desirable.

When the substrate set is small or the packaging container is small, even if the height of the side protrusion (the same applies to the bottom protrusion) is about 1 mm, it will remain effective. On the other hand, in order to firmly hold the substrate set, it is preferable that the side protrusion protrudes by 2 mm or more.

Here, the four side portions connected to the four edges of the bottom portion are configured to stand to be perpendicular to the bottom portion. On the other hand, in order to facilitate the loading and unload of the substrate set, it is effective to provide a taper (open inclination) of 1° or more on the four side portions such that the opening expands with respect to the bottom portion. Further, in order to smoothly put the substrate set in and out of the packaging container, it is preferable to provide a taper of 3° or more on the four side portions.

Further, in order to suppress the deformation of the opening of the packaging container and increase the strength of the entire container, it is effective that the frame of the opening is formed with a flange that is substantially parallel to the bottom portion and has an outward width of 1 mm or more. In order to further increase the strength, it is preferable that the width of the flange is 3 mm or more. Here, being substantially parallel includes being non-parallel but within the manufacturing error range in addition to being simply parallel.

In addition, the height of the substrate set to be stored may be the same as or lower than the height of the packaging container. In that case, in order to prevent an external impact on the substrate set, the substrate set is fixed to the packaging container by covering the space above the stored substrate set with a cushioning material or the like. On the other hand, when the height of the substrate set is higher than the height of the packaging container, the upper portion of the stored substrate set may be covered with the inverted packaging container for the same purpose. That is, the substrate set may be fixed to the packaging container by being sandwiched between the two packaging containers from above and below.

According to the present embodiment, the types of ceramic substrates constituting the substrate set to be stored in the packing container for transporting include silicon nitride ($Si_3N_4$) substrate, aluminum nitride (AlN) substrate, and alumina (aluminum oxide: $Al_2O_3$) substrate, etc. If the substrate is thin, silicon nitride substrate having high strength and toughness and being easily deformable is considered suitable.

Further, in the present specification, the ceramic substrate also includes a ceramic metal bonded substrate (for example, a silicon nitride metal bonded substrate) in which a metal plate is bonded to both sides or one side, and a ceramic circuit substrate in which a circuit is formed by the metal plate. That is, in addition to the ceramic substrate, the packaging container can also store a substrate set composed of ceramic metal-bonded substrate in which a metal plate is bonded to both sides or one side, or a ceramic circuit substrate in which a circuit is formed by the metal plate.

The packaging container for transporting ceramic substrate needs to be light and durable while having a certain degree of elasticity. Further, it is desirable that the packaging container is thin and easily to be molded into a complicated shape. Further, the packaging container is preferably transparent or translucent so that the internal state can be seen. Examples of the material of the packaging container satisfying these conditions include plastics such as polyethylene (PE), polypropylene (PP), polystyrene (PS), and polyethylene terephthalate (PET resin). In addition, although it is not transparent, natural materials such as paper and sugar cane that are easily recyclable and environmental-friendly can also be used as packaging containers.

Hereinafter, embodiments of a packaging container for transporting ceramic substrates will be described in detail with reference to the drawings.

First Embodiment

The packaging container for transporting ceramic substrates according to the first embodiment vertically stores a substrate set composed of ceramic substrates. The packaging container for transporting ceramic substrates according to the first embodiment will be described with reference to FIGS. 1 to 4.

Figure 1:
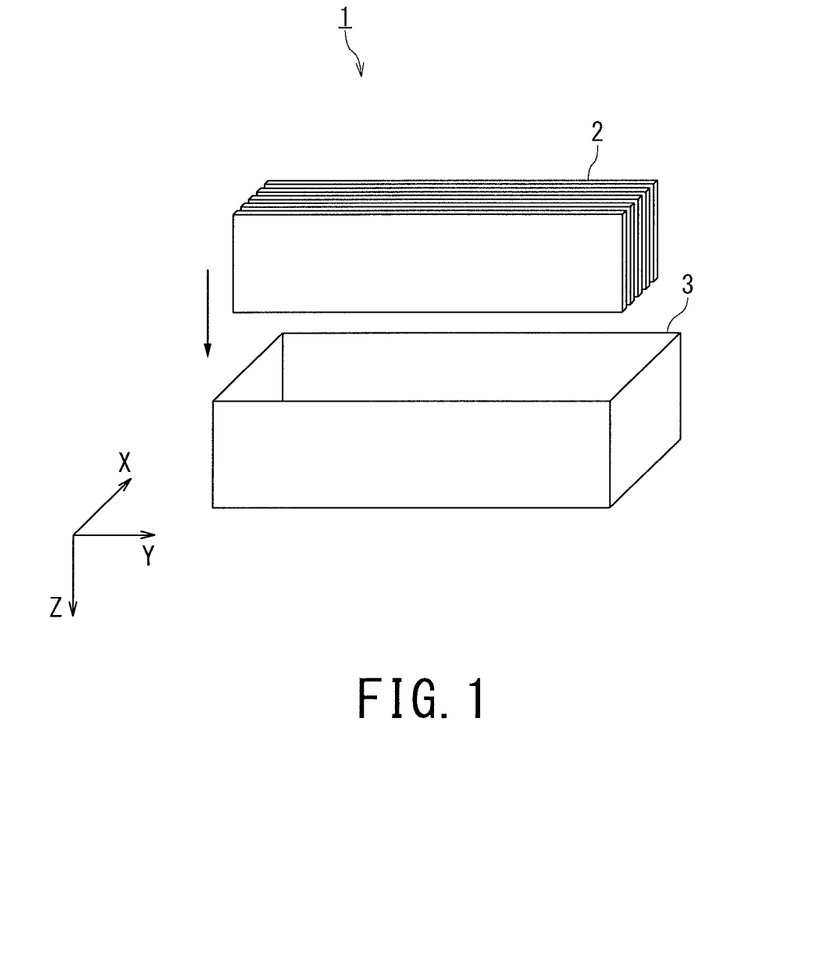
FIG. 1 is a perspective view showing the appearance of the packaging container for transporting ceramic substrates according to the first embodiment.

FIG. 1 is a perspective view showing the appearance of the packaging container for transporting ceramic substrates according to the first embodiment.

Reference numeral 1 in FIG. 1 indicates a state before the ceramic substrate is vertically placed and stored in the packaging container for transportation according to the first embodiment. Reference numeral 2 indicates a substrate set composed of ceramic substrates, and reference numeral 3 indicates a packaging container for transporting ceramic substrates according to the first embodiment. Further, a direction in which the ceramic substrates are stacked, that is, a direction along a bottom portion of the packaging container 3 is defined as the X-axis direction, while another direction along the bottom portion of the packaging container 3 is defined as the Y-axis direction. The insertion direction of the substrate set 2 (arrow shown in FIG. 1), that is, a depth direction of the packaging container 3 is defined as the Z-axis direction.

The packaging container 3 is composed of a rectangular (square or rectangle) bottom portion (bottom portion 7 shown in FIG. 2) and four side portions (back side 8a, left side 8b, front side 8c, right side 8d shown in FIG. 2) connected to the four edges of the bottom portion. In addition, in FIGS. 1 to 4, the case where the bottom portion of the packaging container 3 is a square will be described as an example.

Here, the case where the relationship between the bottom portion and the four side portions of the packaging container 3 is substantially vertical while the bottom portion and the four side portions of the packaging container 3 are connected at right angles will be described, but it is not limited to that case. For example, the four side portions of the packaging container 3 may be tapered, or the bottom portion and the four side portions of the packaging container 3 may be connected by chamfering or in an R-shape, respectively. Here, being substantially vertical includes being non-vertical but within a manufacturing error range in addition to being vertical. The substrate set 2 is inserted into the packaging container 3 from the opening of the packaging container 3 along the direction of the arrow shown in FIG. 1 with the edges of each ceramic substrate facing down.

Each of FIGS. 2A to 2E shows a configuration example of the packaging container 3 for transporting ceramic substrates according to the first embodiment. Each of FIGS. 2A to 2E is a diagram showing a case where bottom protrusions 5 and side protrusions 6 of the packing container 3 protrude in a semicircular shape as compared with FIGS. 4A to 4E described later.

Figure 2A:
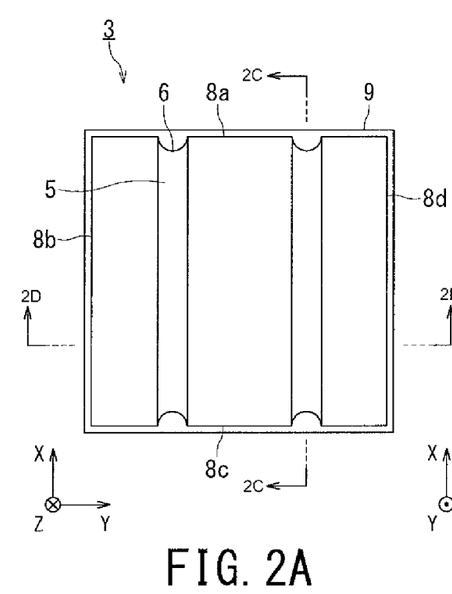
Figure 2B:
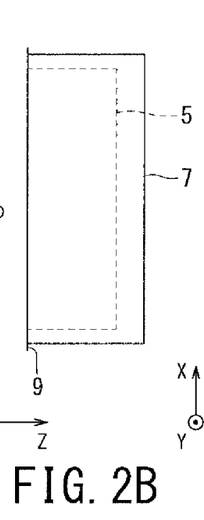
Figure 2C:
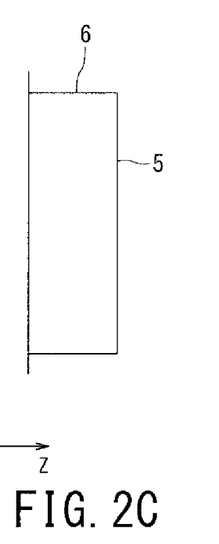
Figure 2D:
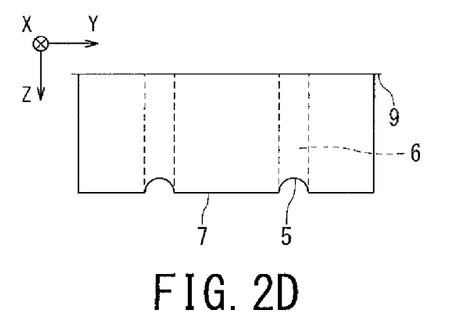
Figure 2E:
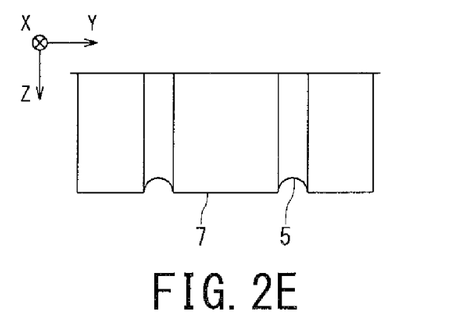

FIG. 2A is a view (plan view) of the packaging container 3 as viewed from above. FIG. 2B is a right side view of the packaging container 3. FIG. 2C is a cross-sectional view taken along the line 2C-2C in FIG. 2A. FIG. 2D is a front view of the packaging container 3, and FIG. 2E is a sectional view taken along the line 2E-2E in FIG. 2A. The back side 8a and the front side 8c among the four side portions of the packaging container 3 are provided with two rows of semi-cylindrical side protrusions 6 having a semicircular shape and continuously extending in the depth direction. The bottom portion 7 of the packaging container 3 are provided with two rows of semi-cylindrical bottom protrusions 5 having a semicircular shape and extending continuously from the front to the back (or from the back to the front). It is preferable that the protrusions 5 and 6 have an inward-protruding height of 2 mm or more. The protrusions 5 and 6 may be formed by deforming (e.g., pressing) a part of the flat plate. It may be manufactured by attaching a member to a flat plate. It may be produced by casting the material into a mold having a partial recess. Further, it is preferable that the flange 9 is formed on the entire circumference of the frame of the opening of the packaging container 3.

Figure 3:
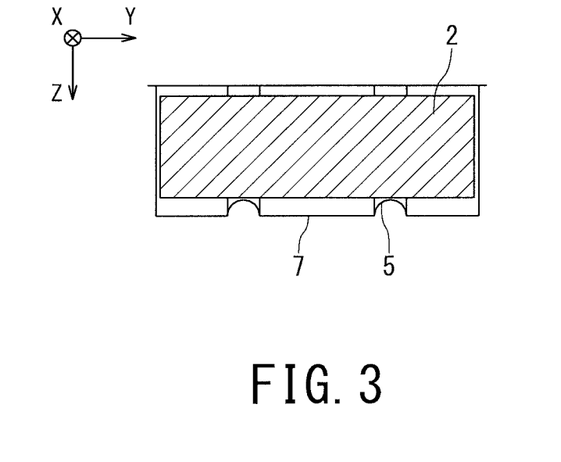
FIG. 3 is a cross-sectional view showing a state in which the substrate set is stored in the packaging container for transporting ceramic substrates according to the first embodiment.

FIG. 3 is a front view showing a packing container 3 in a state where the substrate set 2 is stored. FIG. 3 shows a cross-sectional view taken along the line B-B in (a) of FIG. 2. The packing container 3 supports the substrate set 2 by the two rows of bottom protrusions 5 formed on the bottom portion 7 that provide cushioning and prevent an impact during transportation. The two rows of side protrusions 6 formed on the side portions prevent an impact during transportation by holding the surface of the substrate set 2 composed of the overlapped ceramic substrates.

In FIGS. 2A to 2E, though the bottom protrusions 5 of the bottom portion 7 and the side protrusions 6 of the side portions are connected to each other, they may be formed at different positions, that is, at positions where they are not connected. Further, though the two side protrusions 6 extend in the depth direction and traverse the side portions, a protrusion may be additionally formed in the directions parallel to the Y-axis and the X-axis directions. Further, the side protrusions 6 may be separated in the middle, that is, the side protrusions 6 may be intermittent rather than continuous. Alternatively, the side protrusions 6 on the side portions may be formed vertically in one row. Further, the side protrusions 6 may be separated in the middle and be provided in two rows. Further, the area of the side protrusions 6 may be 25% or more of the entire side portion.

The protrusions 5 and 6 each having two rows can still be effective even only one row of each is provided, but it is desirable that there are two or more rows in order to support the substrate set 2.

Further, the protrusions 5 and 6 may protrude in a square (rectangular cuboid) shape as shown in FIGS. 4A to 4E instead of a semicircular (semi-cylindrical) shape.

FIGS. 4A to 4E shows a configuration example of the packaging container 3 for transporting ceramic substrates according to the first embodiment. Each of FIGS. 4A to 4E is a diagram showing a case where the bottom protrusions 5 and the side protrusions 6 of the packaging container 3 protrude in a U-shape as compared with FIGS. 2A to 2E. At least one of the bottom protrusions 5 and the side protrusions 6 protruding in a semicircular shape (shown in FIGS. 2A to 2E) or in a U-shape (shown in FIGS. 4A to 4E).

Figures 4A, 4B, 4C:
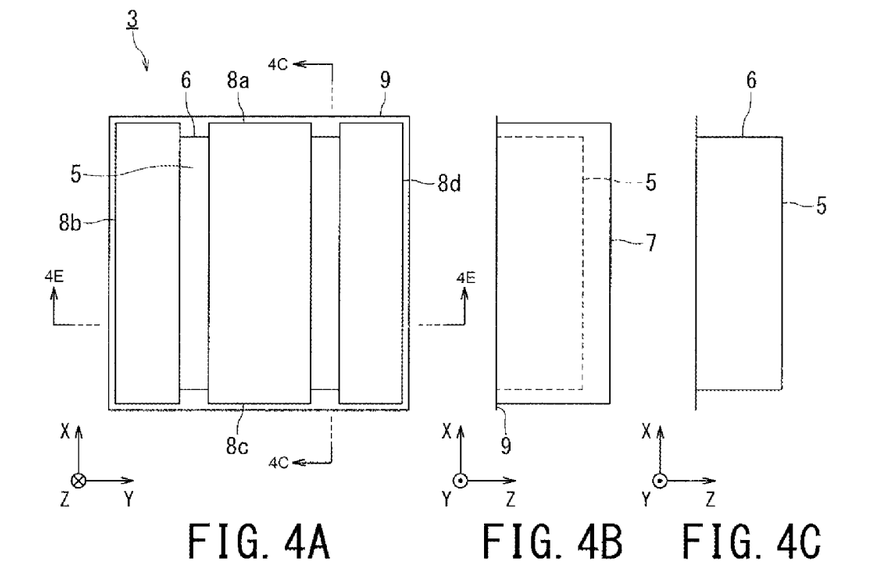
Figure 4D:
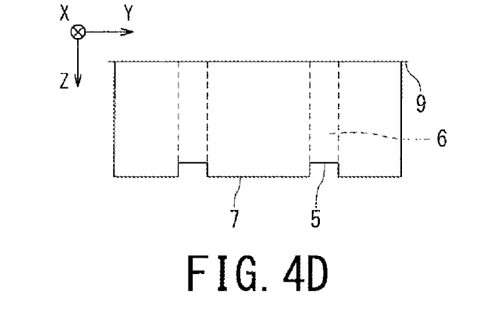
Figure 4E:
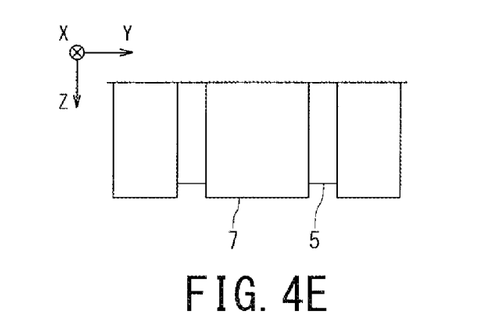

FIG. 4A is a view (plan view) of the packaging container 3 as viewed from above. FIG. 4B is a right side view of the packaging container 3. FIG. 4C is a sectional view taken along the line 4C-4C of FIG. 4A. FIG. 4D is a front view of the packaging container 3. FIG. 4E is a cross-sectional view taken along the line 4E-4E of FIG. 4A. Two rows of U-shaped side protrusions 6 extending continuously in the depth direction are formed on the back side 8a and the front side 8c among the four side portions of the packaging container 3. The bottom portion 7 of the packaging container 3 is formed with two rows of U-shaped bottom protrusions 5 extending from the front to the back (or from the back to the front). It is preferable that the flange 9 is formed on the entire circumference of the frame of the opening of the packaging container 3.

When the protrusions 5 and 6 as shown in FIGS. 4A to 4E are in U-shape, the area to be suppressed can be larger than that the case using the semicircular shape shown in FIGS. 2A to 2E. In FIGS. 4A to 4E, though the corners of the U-shape protrusions are right angles, when the container is made of plastic or the like, the corners are chamfered. Further, the protrusions 5 and 6 are effective in any shape, such as a triangular shape, as long as the protrusions are formed from the surface.

Further, the protrusions 5 and 6 shown in FIGS. 4A to 4E do not have to extend over the entire surface, and may be formed only at locations in contact with the ceramic substrates 2.

The side protrusions 6 of the packaging container 3 that face the outer surfaces of the two ceramic substrates at both ends of the substrate set 2 are not required to be continuous. Such protrusions can be separated in the middle as long as the two ceramic substrates can be held by several places.

Further, in order to facilitate the loading and unloading of the substrate set 2, it is effective to provide a taper (open inclination) of 1° or more on the side portions of the packaging container 3 such that the opening expands with respect to the bottom portion V. Further, in order to strengthen the opening of the packaging container 3, it is effective to form a flange 9 having a width of 1 mm or more on the entire circumference of the frame of the opening.

According to the packaging container 3 according to the first embodiment, the ceramic substrate can be easily packed while the external impact and impact occurs between stacked ceramic substrates during transportation of the packaging container 3 in which the substrate set 2 is vertically stored can be suppressed.

Second Embodiment

The packaging container for transporting ceramic substrates according to the second embodiment horizontally stores a substrate set composed of ceramic substrates. The packaging container for transporting ceramic substrates according to the second embodiment will be described with reference to FIGS. 5 to 12.

Figure 5:
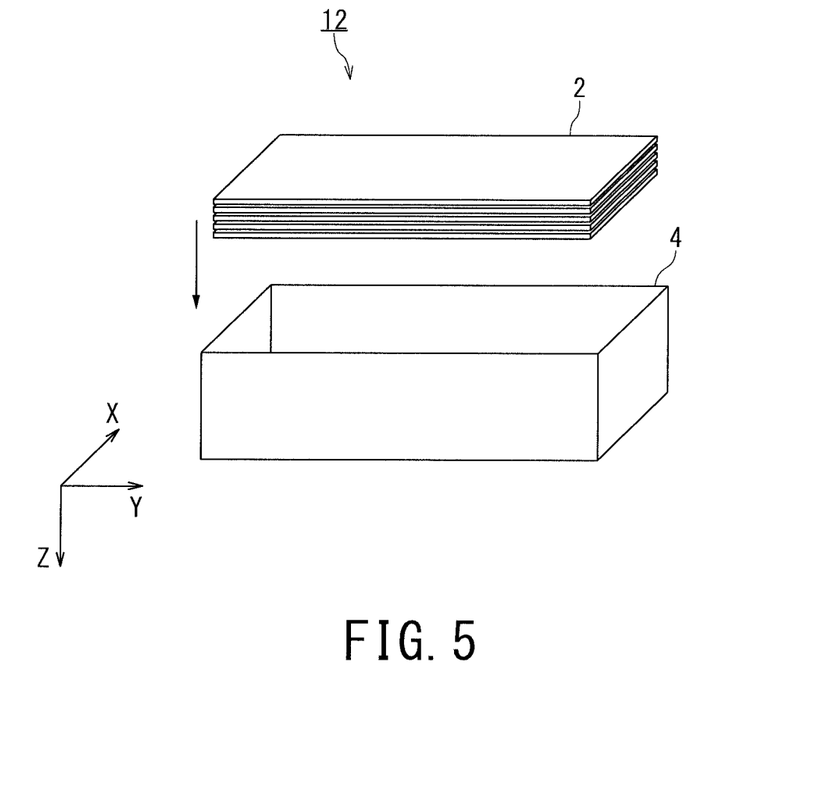
FIG. 5 is a perspective view showing the appearance of the packaging container for transporting ceramic substrates according to the second embodiment.

FIG. 5 is a perspective view showing the appearance of the packaging container for transporting ceramic substrates according to the second embodiment.

Reference numeral 12 in FIG. 5 indicates a state before the ceramic substrate is horizontally placed and stored in the packaging container for transporting ceramic substrates according to the second embodiment. Reference numeral 2 indicates a substrate set composed of ceramic substrates, and reference numeral 4 indicates a packaging container for transporting ceramic substrates according to the second embodiment. Further, the direction in which ceramic substrates are stacked, that is, one direction along the bottom portion of the packaging container 4 is defined as the X-axis direction, while another direction along the bottom portion of the packaging container 4 is defined as the Y-axis direction. The insertion direction of the substrate set 2 (arrow shown in FIG. 5), that is, the depth direction of the packaging container 4 is defined as the Z-axis direction.

Figure 6:
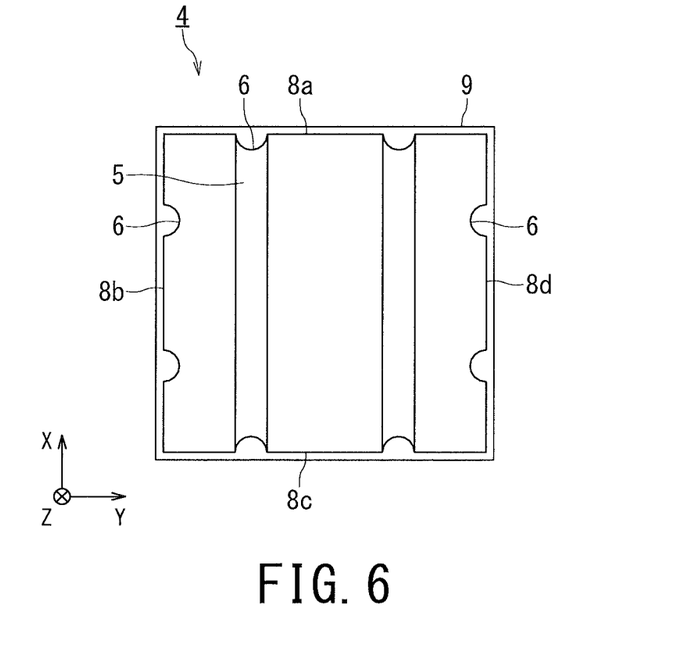
FIG. 6 is a top view showing a case where the side protrusions and the bottom protrusions protrude in a semicircular shape in the packaging container for transporting ceramic substrates according to the second embodiment.

The packaging container 4 is composed of a rectangular (square or rectangular) bottom portion and four side portions (back side 8a, left side 8b, front side 8c, right side 8d shown in FIG. 6) connected to the edges of the bottom portion. In addition, in FIGS. 5 to 12, the case where the bottom portion of the packaging container 4 is a square will be described as an example.

Here, the case where the relationship between the bottom portion of the packaging container 4 and the four side portions is substantially vertical and the bottom portion and the four side portions of the packaging container 4 are connected at right angles will be described, but it is not limited to that case. For example, the four side portions of the packaging container 4 may be tapered, or the bottom portion and the four side portions of the packaging container 4 may be respectively connected by chamfering or in R-shape. The substrate set 2 is inserted into the packaging container 4 through the opening along the direction of the arrow shown in FIG. 5 such that the outer surface of one of the ceramic substrates of the substrate set 2 faces down.

FIG. 6 shows a top view of the packaging container 4 for transporting ceramic substrates according to the second embodiment. On all the side portions (8a, 8b, 8c and 8d) of the packaging container 4, two rows of semi-cylindrical side protrusions 6 having a semicircular shape and continuously extending in the depth direction are formed. on the bottom portion of the packaging container 4, two rows of semi-cylindrical bottom protrusions 5 having a semicircular shape and extending continuously in the direction from the back side 8a to the front side 8c (parallel to the X-axis direction) are formed. It is preferable that the protrusions 5 and 6 have an inward-protruding height of 2 mm or more. It is preferable that the flange 9 is formed on the entire circumference of the frame of the opening.

Figure 7:
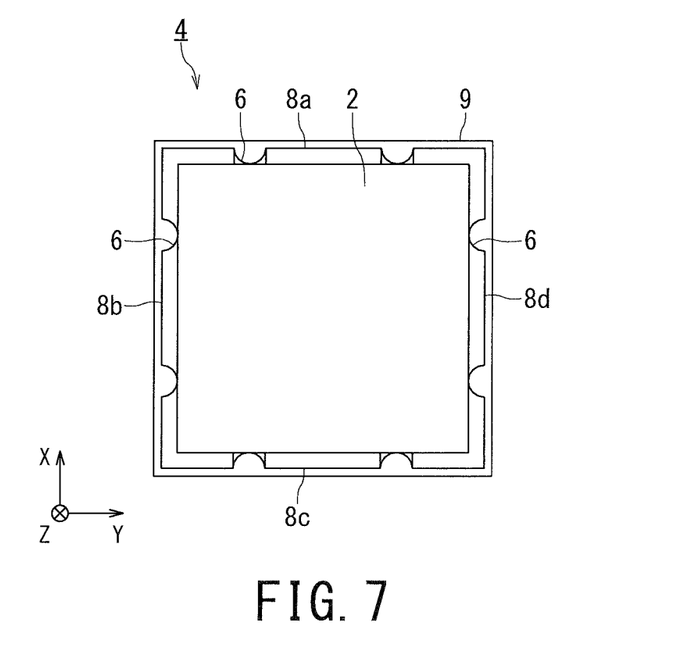
FIG. 7 is a top view showing a state in which the substrate set is stored in the packaging container for transporting ceramic substrates according to the second embodiment.

FIG. 7 is a top view showing a a state where the substrate set 2 is stored in the packing container 4 for transporting ceramic substrates according to the second embodiment. The impact is prevented by holding the substrate set 2 with, for example, two rows of bottom protrusions 5 (shown in FIG. 6) formed on the bottom portion. Also, the impact is prevented by holding the edge of the substrate set 2 with, for example, two rows of side protrusions 6 formed on each of the four side portions.

Figure 8:
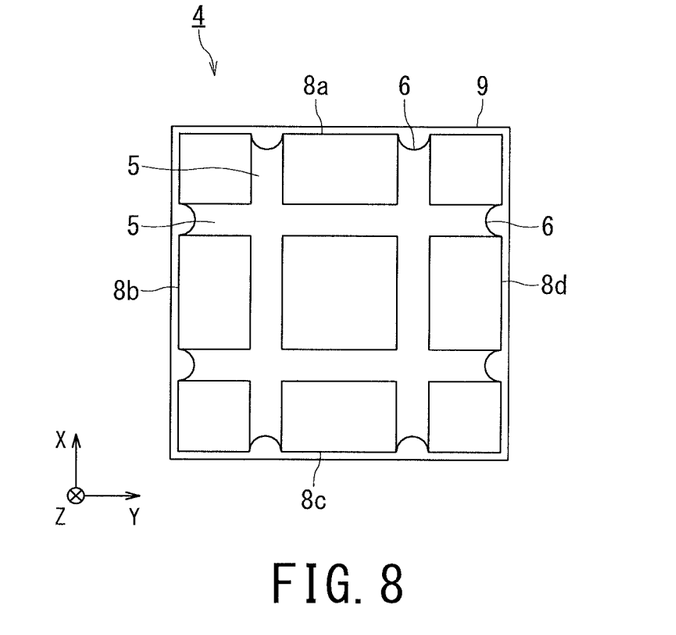
FIG. 8 is a top view showing a case where two rows of the bottom protrusions intersect with the other two rows of protrusions in the packaging container for transporting ceramic substrates according to the second embodiment.
Figure 9:
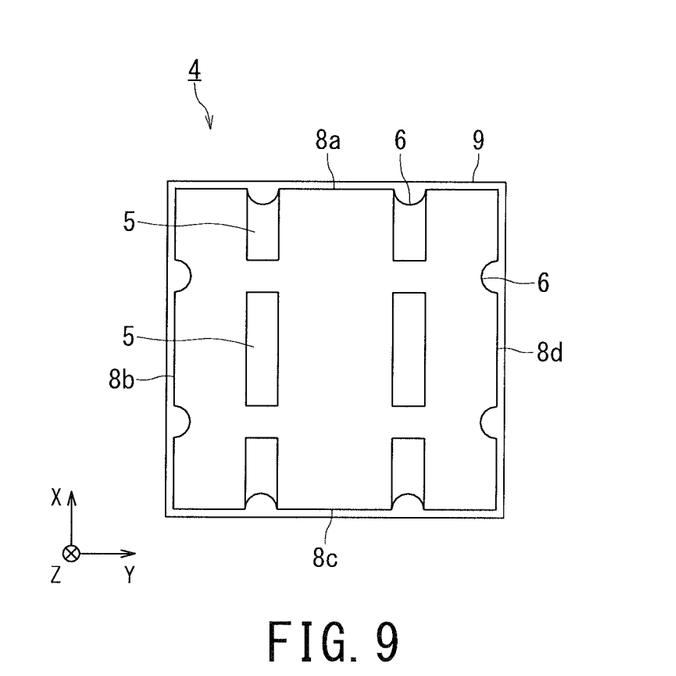
FIG. 9 is a top view showing a case where the bottom protrusions are separated in the packaging container for transporting ceramic substrates according to the second embodiment.

In FIG. 6, though the bottom protrusions 5 on the bottom portion and the side protrusions 6 on the two opposite side portions are connected to each other, they may be formed at different positions, that is, at positions where they are not connected. Further, though the two rows of the bottom protrusions 5 on the bottom portion are formed to extend in the direction from the back side 8a to the front side 8c (parallel to the X-axis direction), it is not limited to this case. For example, as shown in FIG. 8, the bottom protrusion 5 may include protrusions extending in the direction parallel to the Y-axis direction and the X-axis direction. Further, for example, as shown in FIG. 9, intermittent bottom protrusions 5 may be formed on the bottom portion in a direction from one side portion to the other side portion (parallel to the X-axis direction) of two opposite side portions among the four side portions.

Figure 10:
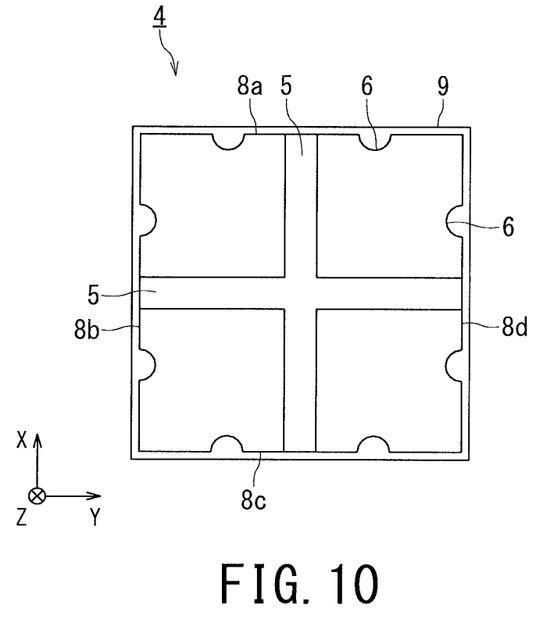
FIG. 10 is a top view showing a case where one row of the bottom protrusion intersects with another row of protrusion in the packaging container for transporting ceramic substrates according to the second embodiment.
Figure 11:
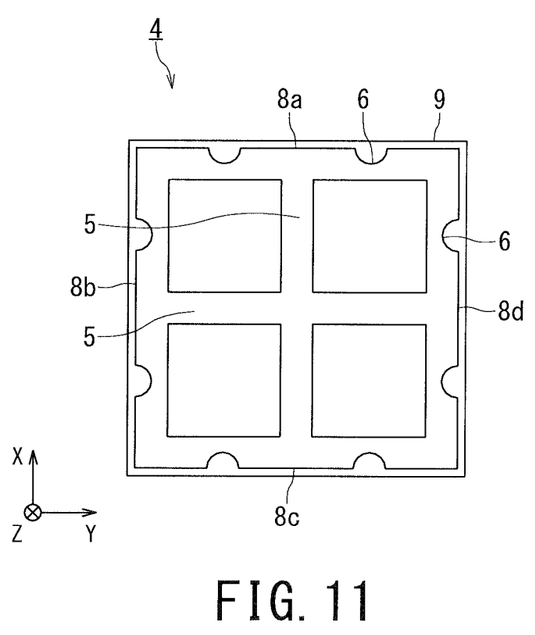
FIG. 11 is a top view showing a case where the bottom protrusions are separated from the side portions in the packaging container for transporting ceramic substrates according to the second embodiment.
Figure 12:
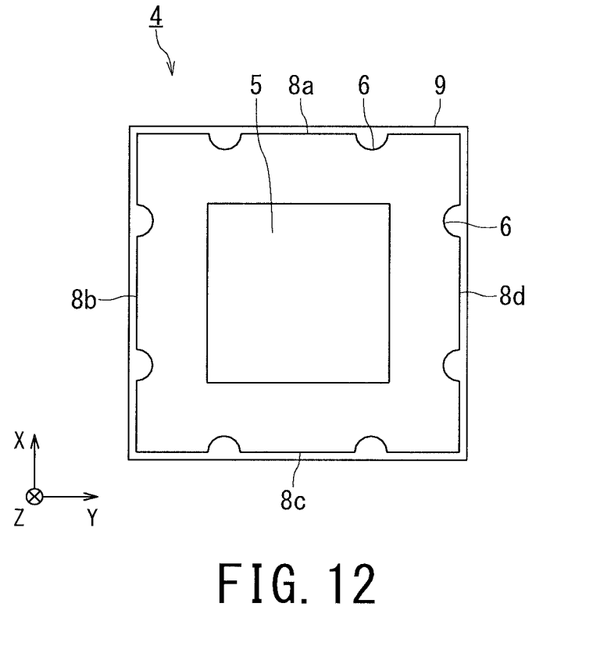
FIG. 12 is a top view showing a case where there is only one bottom protrusion in the packaging container for transporting ceramic substrates according to the second embodiment.

Alternatively, for example, as shown in FIG. 10, one row of bottom protrusion 5 may be formed on the bottom portion extending continuously in the direction from one side portion to the other side portion (parallel to the X-axis direction) of two opposite side portions among the four side portions, while another row of bottom protrusion 5 may be formed on the bottom portion extending continuously in the direction from one side portion to the other side portion (parallel to the Y-axis direction) of the other two opposite side portions among the four side portions. In that case, it is preferable that the two protrusions on the bottom portion intersect at the nearly center of the bottom portion. Here, the nearly center includes the non-center but within the manufacturing error range in addition to the true center. Further, for example, as shown in FIG. 11, the bottom protrusions 5 may not be continuous from the end portion, and may be separated in the middle and be provided in two rows. That is, the bottom protrusions 5 may include a protrusion formed in a rectangular shape along the edge of the bottom portion. Further, as shown in FIG. 12, the bottom protrusion 5 may be one protrusion which area occupies 25% or more of the entire bottom portion.

In FIG. 6, two rows of the protrusions are provided on each of the bottom portion and the four side portions. Though such protrusion will still be effective even in one row, it is desirable to have two or more rows in order to hold the substrate set 2.

Further, the protrusions provided on the bottom portion and the four side portions are not limited to be in a semicircular shape. As long as the protrusions are formed from the surface no matter in a square shape or a triangular shape, it is effective regardless of the shape of the protrusion.

Further, the protrusions provided on the bottom portion and the four side portions do not have to extend over the entire surface, and may be formed only at the positions in contact with the substrate set 2.

Further, in order to facilitate the loading and unloading of the ceramic substrate, it is effective to provide a taper (open inclination) of 1° or more on the four side portions such that the opening expands with respect to the bottom portion. Further, in order to strengthen the opening of the packaging container 4, it is effective to form a flange having a width of 1 mm or more on the entire circumference of the frame of the opening.

According to the packaging container 4 according to the second embodiment, the ceramic substrate can be easily packed while the external impact and impact occurs between stacked ceramic substrates during transportation of the packaging container 4 in which the substrate set 2 is horizontally stored can be suppressed.

According to at least one embodiment described above, it is possible to easily pack the ceramic substrate while suppressing external impact and impact occurs between stacked ceramic substrates during transportation of the packaging container in which the substrate set is stored.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A packaging container for transporting a plurality of ceramic substances, the packaging container packing a ceramic substrate set composed of the plurality of ceramic substrates that are stacked, the packaging container comprising:
    a bottom portion having a rectangle; and
    four side portions connected to four edges of the bottom portion respectively, wherein
    side protrusions having a height of 2 mm or more facing inward are provided to at least two side portions facing each other among the four side portions such that the side protrusions contact the ceramic substrate set and hold the ceramic substrate set as a unit,
    the bottom portion is provided with a bottom protrusion having a height of 2 mm or more facing inward such that the bottom portion contacts the ceramic substrate set and holds the ceramic substrate set as a unit, and
    wherein the packaging container is configured to have a size relative to a size of the ceramic substrate set such that the ceramic substrate set presses against the packaging container due to deformation of the ceramic substrate set during packing of the ceramic substrate set in the packaging container.

2. The packaging container according to claim 1, wherein the ceramic substrate set is stored such that outer surfaces of the two ceramic substrates face two opposite side portions among the four side portions respectively,
    each of the two side portions is provided with two or more rows of side protrusions extending continuously in a depth direction as the side protrusions, and
    two or more rows of bottom protrusions are provided on the bottom portion as the bottom protrusion, the two or more rows of bottom protrusions extending continuously in a direction from one side portion to the other of two opposite side portions among the four side portions.

3. The packaging container according to claim 1, wherein the ceramic substrate set is stored such that an outer surface of the ceramic substrate at one end faces the bottom portion, and
    two or more rows of side protrusions extending continuously in a depth direction are provided on each of the four side portions.

4. The packaging container according to claim 3, wherein two rows of bottom protrusions are provided on the bottom portion as the bottom protrusion, the two rows of bottom protrusions extending continuously in a direction from one side portion to the other of the two opposite side portions among the four side portions.

5. The packaging container according to claim 3, wherein two rows of bottom protrusions are provided on the bottom portion as the bottom protrusion, the two rows of bottom protrusions extending continuously in a direction from one side portion to the other of two opposite side portions among the four side portions, and two rows of bottom protrusions are provided on the bottom portion as the bottom protrusion, the two rows of bottom protrusions extending continuously in a direction from one side portion to the other of the other two opposite side portions among the four side portions.

6. The packaging container according to claim 3, wherein two rows of bottom protrusions are provided on the bottom portion as the bottom protrusion, the two rows of bottom protrusions extending intermittently in a direction from one side portion to the other of two opposite side portions among the four side portions.

7. The packaging container according to claim 3, wherein one row of bottom protrusion is provided on the bottom portion as the bottom protrusion, the one row of bottom protrusion extending continuously in a direction from one side portion to the other of two opposite side portions among the four side portions, and one row of bottom protrusion is provided on the bottom portion as the bottom protrusion, the one row of bottom protrusion extending continuously in a direction from one side portion to the other of the other two opposite side portions among the four side portions, and
    the two bottom protrusions intersect at a nearly center of the bottom portion.

8. The packaging container according to claim 7, wherein, the bottom protrusion includes a protrusion formed in a rectangle along an edge of the bottom portion.

9. The packaging container according to claim 1, wherein the ceramic substrate set is stored such that an outer surface of the ceramic substrate at one end faces the bottom portion, and
    one bottom protrusion having an area ratio of 25% or more to a total area of the bottom portion is provided to the bottom portion as the bottom protrusion.

10. The packaging container according to claim 1, wherein at least one of the bottom protrusion and the side protrusions of the at least two opposite side portions protrudes in a semicircular shape or a U-shape.

11. The packaging container according to claim 1, wherein the four side portions have a shape that stands perpendicular to the bottom portion.

12. The packaging container according to claim 1, wherein the four side portions are tapered such that an opening expands with respect to the bottom portion.

13. The packaging container according to claim 1, wherein an outer frame forming an opening is formed with a flange substantially parallel to the bottom portion and outward.

14. The packaging container according to claim 1, wherein a material of the packaging container for transporting ceramic substrates is plastic.

15. The packaging container according to claim 1, wherein the ceramic substrate is a silicon nitride substrate or a silicon nitride metal bonding substrate.

* * * * *